United States Patent
Hsu et al.

(10) Patent No.: US 6,911,689 B2
(45) Date of Patent: Jun. 28, 2005

(54) VERSATILE SYSTEM FOR CHROMIUM BASED DIFFUSION BARRIERS IN ELECTRODE STRUCTURES

(75) Inventors: Wei-Yung Hsu, San Jose, CA (US); Scott Summerfelt, Garland, TX (US); Paul McIntyre, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/247,227

(22) Filed: Sep. 19, 2002

(65) Prior Publication Data

US 2003/0077874 A1 Apr. 24, 2003

Related U.S. Application Data

(60) Provisional application No. 60/323,481, filed on Sep. 19, 2001.

(51) Int. Cl.[7] .................. H01L 27/108; H01L 29/76; H01L 31/119
(52) U.S. Cl. ............... 257/306; 257/309; 257/296; 257/297
(58) Field of Search ................. 257/310, 303, 257/306; 438/239, 240, 396

(56) References Cited

U.S. PATENT DOCUMENTS

| | | | | |
|---|---|---|---|---|
| 6,090,697 A | * | 7/2000 | Xing et al. | 438/618 |
| 6,150,692 A | * | 11/2000 | Iwanaga et al. | 257/315 |
| 6,261,934 B1 | * | 7/2001 | Kraft et al. | 438/592 |
| 6,350,643 B1 | * | 2/2002 | Hintermaier et al. | 438/240 |
| 6,485,988 B2 | * | 11/2002 | Ma et al. | 438/3 |
| 6,518,070 B1 | * | 2/2003 | Alluri et al. | 438/3 |

* cited by examiner

*Primary Examiner*—Amir Zarabian
*Assistant Examiner*—Pamela E Perkins
(74) *Attorney, Agent, or Firm*—Carlton H. Hoel; W. James Brady; Frederick J. Telecky, Jr.

(57) ABSTRACT

A versatile system providing Cr-based diffusion barriers and electrode structures utilizing such barriers is disclosed, including a semiconductor substrate (102), a dielectric layer (106) disposed upon the substrate, a Cr-based conductive layer (114) disposed upon the dielectric layer, and an electrode layer (116) disposed upon the conductive layer.

3 Claims, 1 Drawing Sheet

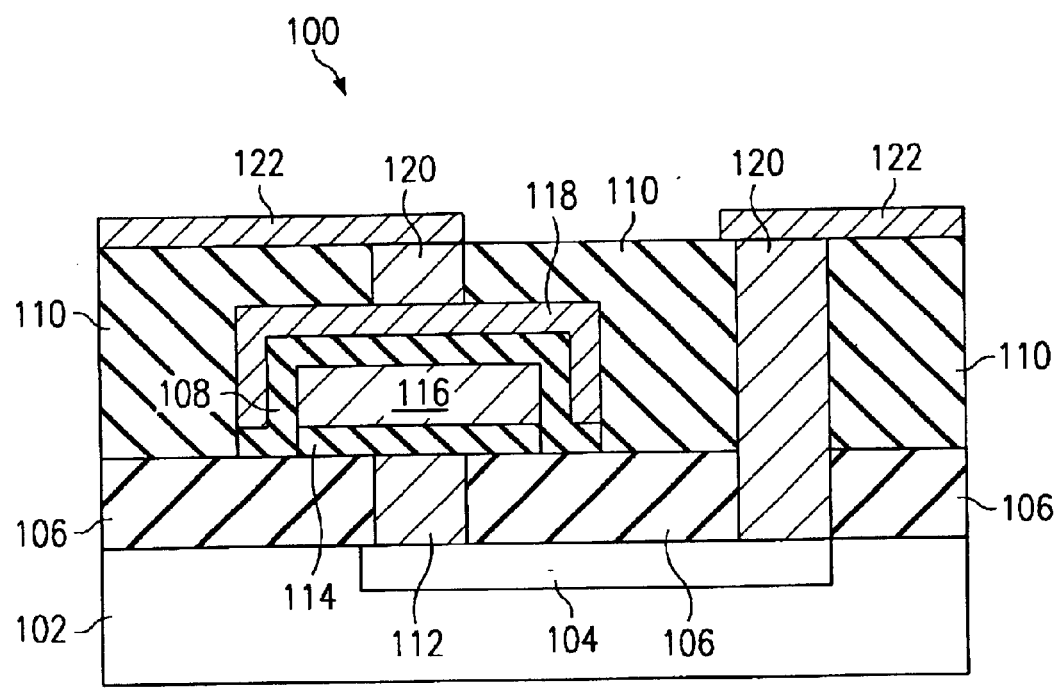

VERSATILE SYSTEM FOR CHROMIUM BASED DIFFUSION BARRIERS IN ELECTRODE STRUCTURES

This application claims the benefit of Provisional Application No. 60/323,481 filed on Sep. 19, 2001.

FIELD OF THE INVENTION

This invention relates, in general, to improving electrical connections in semiconductor device processing and, in particular, to improving electrical connections to materials with high dielectric constants, such as in the construction of capacitors.

BACKGROUND OF THE INVENTION

The increasing density of high performance integrated circuits (e.g., Gbit range DRAMs) is increasing the need for the use of materials with high dielectric constants in electrical devices and structures, such as capacitors. Generally, capacitance is directly related to the surface area of an electrode in contact with the capacitor dielectric, but is not significantly affected by the electrode volume. Current methods generally utilized to achieve higher capacitance per unit area increase the surface area/unit area by increasing the topography, such as in trench and stack capacitors using $SiO_2$ or $SiO_2/Si_3N_4$ as the dielectric. This approach becomes very difficult in terms of manufacturability for devices such as high capacity DRAM.

An alternative approach is to use a high permittivity dielectric material. Many perovskite, ferroelectric, or high dielectric constant (hereafter abbreviated HDC) materials, such as $(Ba,Sr)TiO_3$ (BST), usually have much larger capacitance densities than standard $SiO_2$—$Si_3N_4$—$SiO_2$ capacitors. Various metals and metallic compounds, and typically noble metals such as Pt and conductive oxides such as $RuO_2$, have been proposed as the electrodes for these HDC materials. To be useful in electronic devices, however, reliable electrical connections should generally be constructed which do not diminish the beneficial properties of these high dielectric constant materials.

As used herein, the term Ahigh dielectric constant@ means a dielectric constant of about 50 or greater at device operating temperature. HDC materials are useful for the fabrication of many electrical devices, such as capacitors. However, HDC materials are generally not chemically stable when deposited directly on a semiconductor substrate, so one or more additional layers are required to provide the electrical connection between the HDC material and the substrate. The additional layer or layers should generally be chemically stable when in contact with the substrate and also when in contact with the HDC material. Additionally, due to unit are constraints, high density devices (e.g., Gbit range DRAMs) generally require a structure in which the lower electrode is conductive from the HDC material down to the substrate. The deposition of an HDC material usually occurs at a high temperature (generally greater than about 500° C.) in an oxygen containing atmosphere. An initial electrode structure formed prior to this deposition should be stable both during and after this deposition, while subsequent electrode structures formed after this deposition need only be stable after this deposition.

There are a number of problems with the materials thus far chosen for the electrodes in standard thin-film (herein defined as generally less than 5 microns ($\mu$m)) applications. For example, although Pt is unreactive with respect to the HDC material, it has been found that it is difficult to use Pt alone as an initial electrode. Pt generally allows oxygen to diffuse through it and hence typically allows neighboring materials to oxidize. In addition, Pt also does not normally stick very well to traditional dielectrics such as $SiO_2$ or $Si_3N_4$, and Pt can rapidly form a silicide at low temperatures.

Thus, a diffusion barrier is required to block the reaction between Pt and polysilicon. Such a diffusion barrier should have limited oxidation, as oxidation of the diffusion barrier will result in a rough Pt surface and high leakage current in the capacitor.

Materials such as TiN have been evaluated for this application. TiN is capable of blocking the diffusion of Pt and Si. However, TiN will oxidize to form $TiO_2$, a process that is not self-limited and thus also results in a rough Pt surface and related problems.

Other materials such as TiAlN have also been proposed for this application. Oxidation of TiAlN will form a thin $Al_2O_3$ oxide on the surface. Due to the low diffusivity of oxygen and aluminum in $Al_2O_3$, the formation of the $Al_2O_3$ oxide is self-limited. Thus, the surface of TiAlN after oxidation will not have severe roughness. However, fabrication of TiAlN films present a number of other problems for deposition due to factors such as difficulty in maintaining composition uniformity throughout a sputtering target lifetime, difficulty in fabricating TiAlx target material without generating high particle counts, and the lack of a manufacturable CVD deposition solution.

Conductive oxides such as $RuO_2$ generally also exhibit problems in standard thin-film structures. For examples, the electrical properties of the structures formed using these oxides are usually inferior to those formed using, e.g., Pt. Many thin-film applications require a small leakage current density in addition to a large capacitance per unit area. The leakage current is sensitive to many variables such as thickness, microstructure, electrodes, electrode geometry and composition. For example, the leakage current of lead zirconium titanate (PZT) using $RuO_2$ electrodes is several orders of magnitude larger than the leakage current of PZT using Pt electrodes. In particular, it appears that the leakage current is controlled by Schottky barriers, and that the smaller leakage current with Pt electrodes appears to be due to the larger work function.

SUMMARY OF THE INVENTION

Therefore, a versatile system for producing diffusion barriers in semiconductor processing that simplifies the deposition process, yields highly refractory and highly oxidation resistant barriers, and results in uniform and proper device structuring, is now needed; providing cost-effective and efficient processing and device performance while overcoming the aforementioned limitations of conventional methods.

The present invention provides a system that utilizes a binary target material in the fabrication of diffusion barriers. The target material provided in the present invention simplifies deposition processes previously utilizing complex compound materials. The present invention yields highly refractory and highly oxidation resistant barriers. The present invention results in uniform and proper device structuring. The present invention provides cost-effective and efficient processing and device performance. The present invention provides greater device manufacturability, less particlization in the manufacturing process, lower cost of ownership, and better step coverage.

One embodiment of the present invention provides a Chromium based nitride or carbide as a diffusion barrier. A number of advantages derive from the present invention and its recognition that the use of a binary material, such as CrN, greatly simplifies device processing and reduces the costs associated therewith. For example, device manufacturers can just buy chromium aluminum target material, as opposed to having to make more complex and expensive titanium target associated with previous methods. The more complex titanium targets are not only harder to make, but an improper structure can result from the intricate processing involved, causing a number of problems over the lifetime of the resulting product. Deposition on the surface of a binary, as provided by the present invention, will be much more uniform than that on the surface of a trinary/compound material.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 1 is an illustrative diagram of a capacitor geometry according to the present invention.

DETAILED DESCRIPTION

While the making and the use of the present invention is discussed in detail below, it should be appreciated that the present invention provides many applicable inventive concepts which can be embodied in a wide variety of specific contexts. The specific embodiments discussed herein are merely illustrative of specific ways to make and use the invention, do not delimit the scope of the invention.

The present invention provides a chromium based nitride or carbide are proposed for the fabrication of diffusion barriers. Oxidation of chromium based nitride or carbide will form self-limited thin $Cr_2O_3$. Thus, surface topography of structures formed will not have severe roughening. The oxidation temperature of chromium nitride (700EC) is much higher than titanium nitride (550EC), and comparable to that of (Ti,Al)N (750EC).

In addition to greater oxidation resistance, chromium based nitrides and carbides are advantageous because: 1) for sputtering deposition of chromium nitride, only a chromium metal target is needed, negating particle generation of the target; and 2) CVD deposition of chromium nitride has been demonstrated with good step coverage, such that chromium nitride as a barrier can be extended to future generations of three dimensional storage node capacitor structures. The present invention comprehends many such applications, such as diffusion barriers in multi-level interconnect technology and high density DRAM storage capacitors with perovskite oxide as a dielectric.

The constant reduction in cell area in DRAMs requires high density capacitors. Ferroelectrics such as $(Ba, Sr) TiO_3$ (BST) are promising high density dielectrics and they have achieved much larger capacitance densities than standard $SiO_2$—$Si_3N_4$—$SiO_2$ (ONO) capacitors. The dielectrics require metallic top and bottom electrodes. The bottom electrode in particular must be stable during the deposition of the oxide which occurs at high temperature (greater than 500EC) deposition in an oxygen containing atmosphere. Therefore, two types of materials have been evaluated as the lower electrode, a noble metal such as Pt or a conductive oxide such as $RuO_2$. There are several problems with these electrodes. Most of these problems are related to integration.

Typically within the context of convention electrode structures, a lower electrode in contact with HDC materials comprises either a noble metal, such as Pt, or a conductive oxide, such as $RuO_2$. Pt has several problems as a lower electrode which prevent it being used alone. As previously explained, Pt easily allows oxygen to diffuse and hence allows neighboring materials to oxidize. Pt does not stick very well to traditional dielectrics such as $SiO_2$ or $Si_3N_4$. Furthermore, Pt rapidly forms a silicide at low temperatures, and forms hillocks under stress.

Currently, electrodes favored for BST are Pt and Ta for bottom electrodes and TiN as top electrodes. During BST deposition, Ta oxidizes and becomes insulated. This renders such electrodes suitable for certain device structures, but unusable for others.

A number of existing methodologies utilize, or have proposed utilizing, a number of exotic materials as both electrodes and electrode buffer layers. Some approaches have proposed electrode structures including alloys of Pt, Pd, Rh as a bottom electrode, and oxides made of Re, Os, Rh and Ir as a buffer layer on Si or polysilicon. Such electrode structures may retain conductivity even after deposition of a dielectric if an appropriate barrier layer(s) is used between the conductive oxide and the silicon substrate. Still other electrode structures utilize Pt as bottom electrode with TiN/Ti as the bottom electrode buffer layer. Such electrodes are stable below 600EC. Degradation is very dependent on the thickness, deposition technique of the titanium nitride, titanium silicide and Pt layers. Other nitride films have been evaluated as either diffusion barriers or directly as electrodes. For example, $TiO_x$, TiN, ZrN, and $ZrO_x$, have been evaluated as diffusion barriers between $Pb(Zr_{0.5}, Ti_{0.5})O_3$ and $SiO_2$. Such evaluations have apparently not considered any of these materials for use as a conductive barrier layer between Pt and polysilicon. ZrN has been observed to oxidize during deposition. Stable nitrides have been evaluated as diffusion barriers between silicon and conductive metals which form a low temperature silicide, such as: Al, W, Cu, Ag, Au and Pt. For example, TiN and HfN have been evaluated as diffusion barriers between silicon and Pd, Cu and Au. Others have evaluated the stability of ZrN between silicon and aluminum. HfN has also been evaluated as a bottom contact for $YBa_2Cu_3O_{7-\Delta}$ (YBCO) growth, but it oxidizes too readily. The oxidation rate of HfN and ZrN is much slower than TiN but, despite this advantage, it oxidizes too much to be of use as a conductive contact to YBCO or PZT. Another class of diffusion barriers between metals and silicon is based on a amorphous metals and nitrides. For example, amorphous Ir—Ta has been investigated as a diffusion barrier. The compound has also been investigated as a bottom contact for $YBa_2Cu_3O_{7-\Delta}$, but it oxidizes too readily. Another amorphous metal nitride (Ta—Si—N) has been shown to be a very good diffusion barrier between Si and Al or Au. The oxidation rate of Ta—Si—N is very slow at high temperatures and larger thicknesses. The initial oxidation rate of the Ta—Si—N is much faster, although it appears to be significantly slower than for TiN.

Although these materials have already been shown to act as diffusion barriers between metals and silicon, they have not been evaluated as barriers between Pt and silicon for HDC bottom electrodes.

As such, most attempts to create a more stable bottom electrode for HDC materials have focused on changing the diffusion barrier material into something more stable to oxygen. The present invention, however, provides oxidation resistant barrier material that is simpler to process and has better oxidation resistance than previous approaches.

One embodiment of the present invention provides for the use of either chromium nitride (CrN) or chromium aluminum nitride (CrAlN) as barriers. CrN and CrAlN are materials with excellent oxidation resistance. One advantage of CrN compared to oxides with similar oxidation resistance (e.g., TiAlN) is that CrN is simpler to produce, as it only contains only one cation compared to two. For example, if deposition is by sputtering, then only a chromium target is necessary as compared to a titanium aluminum target. It is very difficult to make a titanium aluminum target. The composition of a sputtered TiAlN film is not the same as the target, making it difficult to decide what composition of target to purchase in order to obtain the correct aluminum/titanium ratio in the sputtered film. The composition of the film may not be stable in three dimensional structures, such as the bottom of a plug. Therefore, processing and production can become very time consuming. If CVD is performed, then the alloy is again much harder to develop compared to a single target.

Although CrN may have slightly higher resistivity than TiN and low aluminum ratio TiAlN, it is more desirable than TiAlN because it has better oxidation resistance. It therefore can be used to higher temperatures.

FIG. 1 illustrates an exemplary capacitor geometry 100 according to the present invention. Geometry 100 comprises a semiconductor substrate 102. Substrate 102 may comprise Si, GaAs, or any other suitable semiconductor or ceramic substrate. Geometry 100 further comprises optional region 104 disposed upon or within substrate 102, which may comprise a semiconductor device or doped region, or may excluded altogether. Geometry 100 further comprises first level dielectric 106 (e.g., $SiO_2$ or $Si_3N_4$) disposed atop substrate 102, and oxide 108 (e.g., HDC or ferroelectric oxide) partially disposed atop dielectric 106 beneath second level dielectric 110 (e.g., $SiO_2$ or $Si_3N_4$), itself disposed atop dielectric 106. Interposed within dielectric 106 is first plug 112, comprising a metal such polysilicon, W, or TiN. Where region 104 is present, the bottom of plug 112 is adapted to contact region 104. Disposed atop and in contact with plug 112 and dielectric 106, and beneath oxide 108, is bottom electrode buffer layer 114. Bottom electrode 116 is disposed between layer 114 and oxide 108. Top electrode 118 is disposed within layer 110 and atop oxide 108. Metal plugs 120, comprising, e.g., polysilicon, W, or TiN, are transversely disposed throughout geometry 100, beneath, contacting, and providing contact with top metallization layer 122, itself disposed atop layer 110. In accordance with the present invention as herein described, layer 114 is formed of either CrN or CrAlN, or of Cr silicide.

Another embodiment of the present invention provides for the use of HfAlN as barrier layer 114. HfAlN should have better oxidation resistance than even TiAlN. HfN oxidizes much slower than TiN with similar electrical resistivity and, therefore, HfAlN should oxidize even slower than TiAlN. ZrAlN should also behave similarly, although the oxidation rate of ZrN, although better than TiN, is not as good as HfN.

In still another embodiment of the present invention, combinations of these elements are implemented as diffusion barriers, although the simplicity obtained by simpler binary cation combinations or the simplest one cation CrN barrier are somewhat reduced.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. The teachings and concepts of the present invention may be applied to a variety of sensor devices and applications. The principles of the present invention are practicable in a number of technologies. It is therefore intended that the appended claims encompass any such modifications or embodiments.

What is claimed is:

1. An electrode structure, formed within a semiconductor device, comprising:
   a substrate;
   a dielectric layer disposed upon the substrate;
   a conductive layer disposed upon the dielectric layer, wherein the conductive layer is selected from the group consisting of: Cr aluminum nitride, Cr silicide, Cr carbide and combinations thereof; and
   an electrode layer disposed upon the conductive layer.

2. A method of forming an electrode structure within a semiconductor device, comprising the steps of:
   providing a substrate;
   forming a dielectric layer upon the substrate;
   forming a conductive layer upon the dielectric layer, wherein the conductive layer is selected from the group consisting of: Cr aluminum nitride, Cr silicide, Cr carbide end combinations thereof; and
   forming an electrode layer upon the conductive layer.

3. A semiconductor capacitor structure comprising:
   a substrate;
   a first dielectric layer disposed upon the substrate;
   a conductive layer disposed upon the first dielectric layer, wherein the conductive layer is selected from the group consisting of: Cr aluminum nitride, Cr suicide, Cr carbide and combinations thereof;
   a first electrode layer disposed upon the conductive layer;
   an oxide layer disposed atop the first dielectric layer and enclosing the conductive layer and the first electrode layer;
   a second electrode layer disposed upon the oxide layer; and
   a second dielectric layer disposed atop the first dielectric layer and enclosing the second electrode and oxide layers.

* * * * *